US009654119B2

(12) United States Patent
Lee et al.

(10) Patent No.: US 9,654,119 B2
(45) Date of Patent: May 16, 2017

(54) PHASE LOCKED LOOP AND OPERATING METHOD THEREOF

(71) Applicant: ELECTRONICS AND TELECOMMUNICATIONS RESEARCH INSTITUTE, Daejeon (KR)

(72) Inventors: Ja Yol Lee, Nonsan-si (KR); Minjae Lee, Gwangju (KR); Cheon Soo Kim, Daejeon (KR); Jaehyun Kang, Cheongju-si (KR); Minuk Heo, Gwangju (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/184,113

(22) Filed: Jun. 16, 2016

(65) Prior Publication Data
US 2016/0373121 A1 Dec. 22, 2016

(30) Foreign Application Priority Data

Jun. 17, 2015 (KR) .......................... 10-2015-0086019

(51) Int. Cl.
*H03L 7/18* (2006.01)
*H03L 7/093* (2006.01)
(Continued)

(52) U.S. Cl.
CPC .............. *H03L 7/093* (2013.01); *H03L 7/085* (2013.01); *H03L 7/099* (2013.01); *H03L 7/18* (2013.01)

(58) Field of Classification Search
CPC ........................................................ H03L 7/18
See application file for complete search history.

(56) References Cited

U.S. PATENT DOCUMENTS 6,809,598 B1  10/2004 Staszewski et al.
7,042,253 B2 *  5/2006 Su .......................... H03L 7/099
                                                              327/11

(Continued)

OTHER PUBLICATIONS

Ping-Ying Wang, et al., "A Digital Intensive Fractional-N PLL and All-Digital Self-Calibration Schemes", IEEE Journal of Solid-State Circuits, vol. 44, No. 8, pp. 2182-2192, Aug. 2009.

*Primary Examiner* — Hai L Nguyen
(74) *Attorney, Agent, or Firm* — Rabin & Berdo, P.C.

(57) ABSTRACT

Provided is a phase locked loop (PLL) that generates an output clock signal corresponding to a reference clock signal. The phase locked loop (PLL) includes a divider configured to divide the output clock signal to generate a divided clock signal, a time-pulse converter configured to generate a time-pulse conversion signal that has a pulse corresponding to a phase difference between the reference clock signal and the divided clock signal, and a digitally controlled oscillator including an LC resonance circuit for generating the output clock signal and configured to control a frequency of the output clock signal that is determined to correspond to a time constant of the LC resonance circuit according to the time-pulse conversion signal, wherein a sustainment time of changed capacitance is continuously controlled according to a change in the phase difference between the reference clock signal and the divided clock signal.

14 Claims, 6 Drawing Sheets

(51) Int. Cl.
*H03L 7/085* (2006.01)
*H03L 7/099* (2006.01)

(56) References Cited

U.S. PATENT DOCUMENTS

| | | |
|---|---|---|
| 8,350,608 B2 | 1/2013 | Lee et al. |
| 8,432,199 B2 | 4/2013 | Lee et al. |
| 8,552,775 B2 | 10/2013 | Lee et al. |
| 8,816,735 B1 | 8/2014 | Chen et al. |
| 8,841,975 B2 * | 9/2014 | Nakamura ................ H03L 7/02 331/108 A |
| 2009/0097609 A1 | 4/2009 | Chang et al. |
| 2011/0193601 A1 | 8/2011 | Albasini et al. |

* cited by examiner

PHASE LOCKED LOOP AND OPERATING METHOD THEREOF

CROSS-REFERENCE TO RELATED APPLICATIONS

This U.S. non-provisional patent application claims priority under 35 U.S.C. §119 to Korean Patent Application No. 10-2015-0086019, filed on Jun. 17, 2015, the entire contents of which are hereby incorporated by reference.

BACKGROUND

The present disclosure herein relates to an electronic circuit, and more particularly, to a phase locked loop using a time amplifier and an operating method thereof.

In recent, a charge pump and a phase locked loop (PLL) are being mostly used for implementing a radio frequency (RF) synthesizer for multi-band mobile communication. However, the charge pump PLL is integrated with an analog circuit design technology and needs, due to an analog circuit and analog signal characteristics, an extra analog RF library in addition to a design library that provides in a standard digital CMOS process. Thus, the charge pump PLL has a difficulty in integrating with a digital baseband signal processing block that uses a digital CMOS process. Also, the digital baseband signal processing block is being recently developed by a nano-scale digital CMOS process due to a development in process technology.

As such, with a development in nano technology, a digital circuit may easily adapt to a process technology to be manufactured in many cases even without re-designing, but the analog RF circuit has a limitation in that it needs to be re-designed each time the process technology varies. Also, with a nano-scale development in CMOS process technology, there is a drawback in that an operating voltage also decreases.

In the nano-scale digital CMOS process, a lot of time and a lot of costs are being consumed in order to improve many limitations that appear when designing the analog RF circuit. Thus, research and development in digital RF for gradually digitalizing the analog RF circuit block are being actively performed.

SUMMARY

The present disclosure provides a phase locked loop (PLL) and an operating method thereof that increase the frequency control resolution of a digitally controlled oscillator and improve a phase error detection resolution to decrease phase noise.

An embodiment of the inventive concept provides a phase locked loop (PLL) that generates an output clock signal corresponding to a reference clock signal, the phase locked loop (PLL) including a divider configured to divide the output clock signal to generate a divided clock signal; a time-pulse converter configured to generate a time-pulse conversion signal that has a pulse corresponding to a phase difference between the reference clock signal and the divided clock signal; and a digitally controlled oscillator including an LC resonance circuit for generating the output clock signal and configured to control a frequency of the output clock signal that is determined based on a time constant of the LC resonance circuit and the time-pulse conversion signal, wherein a sustainment time of changed capacitance for which capacitance of the LC resonance circuit is maintained in a changed state is continuously controlled according to a change in the phase difference between the reference clock signal and the divided clock signal.

In an embodiment, the time-pulse converter may include a time amplifier that is configured to generate at least one time amplifier output signal that has a pulse width proportional to the phase difference between the reference clock signal and the divided clock signal.

In an embodiment, the time-pulse converter may include a time-pulse conversion unit that is configured to convert the at least one time amplifier output signal into the time-pulse conversion signal through logic operation.

In an embodiment, the time amplifier may be configured to generate a first time amplifier output signal that has a first pulse width proportional to the phase difference between the reference clock signal and the divided clock signal, a second time amplifier output signal that has a second pulse width proportional to the phase difference between the reference clock signal and the divided clock signal, and a reference clock delay signal that is obtained by delaying of the reference clock for a predetermined time, and the pulse width of the first time amplifier output signal and the pulse width of the second time amplifier output signal may be controlled to be different from each other when a phase of the reference clock and a phase of the divided clocks are different from each other.

In an embodiment, the time-pulse converter may include a first logic gate that is configured to output a first gate output signal through first logic operation on the first time amplifier output signal and the reference clock delay signal, and a second logic gate that is configured to output a second gate output signal through second logic operation on the second time amplifier output signal and the reference clock delay signal.

In an embodiment, the first logic operation may be AND operation and the second logic operation may be NAND operation.

In an embodiment, a plurality of capacitors in the LC resonance circuit may be configured to be turned on or off selectively according to the first gate output signal and the second gate output signal.

In an embodiment, the time-pulse converter may include a time amplifier that is configured to generate a reference clock delay signal and a divided-clock delay signal that are obtained by delaying of the reference clock and the divided clock for a predetermined time, and the PLL may further include a comparator that is configured to detect a phase difference between the reference clock delay signal and the divided-clock delay signal to output a phase error value.

In an embodiment, the PLL may further include an integrator that is configured to integrate the phase error value to transmit the integrated value to the digitally controlled oscillator.

In an embodiment, a sustainment time of the changed capacitance may be proportional to a pulse width of the time-pulse conversion signal.

In an embodiment of the inventive concept, an operating method of a phase locked loop (PLL) that generates an output clock signal corresponding to a reference clock signal includes receiving the reference clock signal; dividing the output clock signal to generate a divided clock signal; generating a time-pulse conversion signal that has a pulse corresponding to a phase difference between the reference clock signal and the divided clock signal; and changing capacitance of an LC resonance circuit included in a digitally controlled oscillator for generating the output clock signal according to the time-pulse conversion signal to control a frequency of the output clock signal, wherein a sustainment time of changed capacitance for which the capacitance of the LC resonance circuit is maintained in a changed state is continuously controlled according to a change in the phase difference between the reference clock signal and the divided clock signal.

In an embodiment, the generating of the time-pulse signal may include generating, by a time amplifier, first amplifier output signals that have a first pulse width proportional to the phase difference between the reference clock and the divided clock; generating, by the time amplifier, second amplifier output signals that have a second pulse width proportional to the phase difference between the reference clock and the divided clock; generating, by the time amplifier, a reference clock delay signal that is obtained by delaying of the reference clock for a predetermined time; generating a first gate output signal through first logic operation on the first time amplifier output signal and the reference clock delay signal; and generating a second gate output signal through second logic operation on the second time amplifier output signal and the reference clock delay signal, wherein the first pulse width and the second pulse width may be controlled to be different from each other, when a phase of the reference clock and a phase of the divided clock are different from each other.

In an embodiment, the sustainment time of the changed capacitance may be continuously adjusted according to the first gate output signal and the second gate output signal.

In an embodiment, a plurality of capacitors in the LC resonance circuit may be configured to be turned on or off selectively according to the first gate output signal and the second gate output signal.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
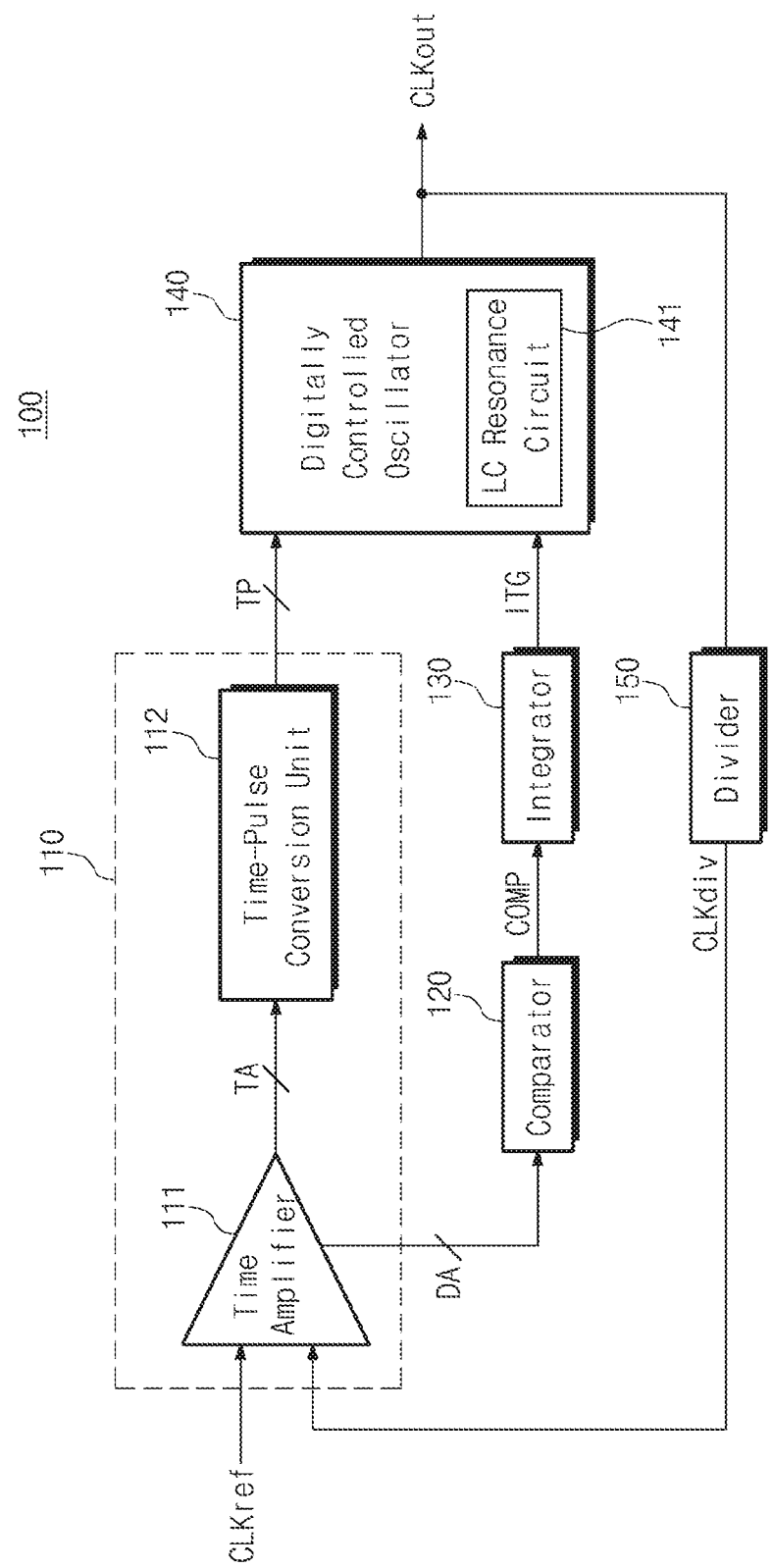
FIG. 1 is a block diagram of a phase locked loop (PLL) according to an embodiment of the inventive concept.

It should be understood that both the foregoing general description and the following detailed description are exemplary, and it should be appreciated that the additional description of the claimed invention is provided. Reference numerals are denoted in detail in the exemplary embodiments of the inventive concept and their examples are indicated in the accompanying drawings. The same reference numerals are used in the description and drawings in order to refer to the same or similar parts wherever possible.

In the following, a phase locked loop (PLL) would be used as an example of an electronic circuit for explaining the characteristics and functions of the inventive concept. However, a person skilled in the art would be able to easily understand other advantages and performance of the inventive concept based on the details described herein. Also, the inventive concept would be able to be implemented or applied through other embodiments. In addition, the detailed description may be modified or changed according to a viewpoint and an application without departing significantly from the scope, technical spirit and other purposes of the inventive concept.

FIG. 1 is a block diagram of a PLL according to an embodiment of the inventive concept. Referring to FIG. 1, a PLL 100 may include a time-pulse converter 110, a comparator 120, an integrator 130, a digitally controlled oscillator 140, and a divider 150. A frequency of an output clock CLKout may be determined by a LC resonance circuit 141 in the digitally controlled oscillator 140. The frequency of the output clock CLKout may be changed by the adjustment of capacitance of the LC resonance circuit 141.

The PLL 100 plays a role in locking the frequency of the output clock CLKout corresponding to a reference clock CLKref. Locking the frequency of the output clock CLKout means compensating a phase difference between the output clock CLKout and the reference clock CLKref every moment to constantly maintain an average frequency of the output clock CLKout. Thus, in order to lock the frequency of the output clock CLKout, the PLL 100 may compare a divided clock CLKdiv obtained by dividing the output clock CLKout with the reference clock CLKref and change the frequency of the output clock CLKout by the phase difference. A variation in the average frequency of the output clock CLKout may increase with an increase in the changed time interval of the frequency of the output clock CLKout.

The time-pulse converter 110 may receive the reference clock CLKref and the divided clock CLKdiv. The time-pulse converter 110 may generate a time-pulse conversion signal TP that corresponds to the phase difference between the reference clock CLKref and the divided clock CLKdiv. For example, the time-pulse conversion signal TP may be a signal obtained when a time corresponding to the phase difference between the reference clock CLKref and the divided clock CLKdiv may be converted into a pulse width.

The time-pulse converter 110 may include a time amplifier 111 and a time-pulse conversion unit 112. The time-pulse amplifier 111 may receive the reference clock CLKref and the divided clock CLKdiv. The time amplifier 111 may generate a time amplifier output signal TA that has a pulse width that is proportional to the phase difference between the reference clock CLKref and the divided clock CLKdiv. The time amplifier output signal TA may include a plurality of pulse signals that are proportional to the phase difference between the reference clock CLKref and the divided clock CLKdiv.

For example, in the case where there is the phase difference between the reference clock CLKref and the divided clock CLKdiv, the time amplifier 111 may generate at least one time amplifier output signal TA that has a pulse proportional to the phase difference between the reference clock CLKref and the divided clock CLKdiv. The at least one time amplifier output signal TA may include a plurality of pulse signals that are proportional to the phase difference between the reference clock CLKref and the divided clock CLKdiv but has pulse widths of different sizes.

The time-pulse conversion unit 112 may receive the time amplifier output signal TA to convert the received signal into the time-pulse conversion signal TP. For example, the time-pulse conversion unit 112 may generate the time-pulse conversion signal TP through at least one logic operation. The time-pulse conversion signal TP may include a plurality of pulse signals for adjusting the capacitance of the LC resonance circuit 141.

The comparator 120 may receive a time amplifier delay signal DA. For example, the time amplifier delay signal DA may include the delay signals of the reference clock CLKref and the divided clock CLKdiv. The comparator 120 may compare the delay signals of the reference clock CLKref and the divided clock CLKdiv to generate a comparison signal COMP. The comparison signal COMP may include information on the sequential relationship of the reference clock CLKref and the divided clock CLKdiv. The comparison signal COMP may be a digital signal. For example, in the case where the phase of the reference clock CLKref is earlier than the phase of the divided clock CLKdiv, the comparison signal COMP may have +1. In the case where the phase of the reference clock CLKref is later than the phase of the divided clock CLKdiv, the comparison signal COMP may have −1.

The integrator 130 may integrate the comparison signal COMP to generate an integrated signal ITG. The integrator 130 may accumulate an phase error between the reference clock CLKref and the divided clock CLKdiv. The comparator 120 and the integrator 130 may function as a low pass filter. Thus, the PLL 100 may remove the high frequency components of the output clock CLKout through the integrator 130.

The digitally controlled oscillator 140 may receive the time-pulse conversion signal TP and the integrated signal ITG. The digitally controlled oscillator 140 may generate the output clock CLKout that varies according to the time-pulse conversion signal TP. For example, the digitally controlled oscillator 140 may include the LC resonance circuit 141 for generating the output clock CLKout. The digitally controlled oscillator 140 may adjust the capacitance of the LC resonance circuit 141 according to the time-pulse conversion signal TP to control the frequency of the output clock CLKout. Also, the digitally controlled oscillator 140 may remove the high frequency components of the output clock CLKout according to the integrated signal ITG.

In order to lock the frequency of the output clock CLKout, the digitally controlled oscillator 140 may change the capacitance of the LC resonance circuit 141 according to the time-pulse conversion signal TP to remove the frequency of the output clock CLKout, in the case where there is the phase difference between the reference clock CLKref and the divided clock CLKdiv. The average frequency of the output clock CLKout would increase with an increase in a time interval that the capacitance of the LC resonance circuit 141 is increased. The average frequency of the output clock CLKout would decrease with an increase in a time interval decreasing the capacitance of the LC resonance circuit 141.

The sustainment time of the changed capacitance of the LC resonance circuit 141 may be controlled according to the pulse width of the time-pulse conversion signal TP. The output clock CLKout would be output with the changed frequency according to the sustainment time of the changed capacitance of the LC resonance circuit 141. Thus, the average frequency of the output clock CLKout may be controlled according to the sustainment time of the changed capacitance of the LC resonance circuit 141. Also, the pulse width of the time-pulse conversion signal TP may be continuously changed according to the phase difference between the reference clock CLKref and the divided clock CLKdiv.

If the pulse width of the time-pulse conversion signal TP is continuously controlled, the sustainment time of the changed capacitance of the LC resonance circuit 141 may also be continuously controlled. Thus, the PLL 100 may continuously control the frequency of the output clock CLKref. The frequency control resolution of the PLL 100 may be enhanced.

The divider 150 may divide the output clock CLKout by a predetermined division value to generate the divided clock CLKdiv. For example, the divider 150 may output the divided clock CLKdiv that has a frequency integer or real number multiple smaller than the output clock CLKout. The divided clock CLKdiv may be generated to have the same frequency as the reference clock CLKref. Also, the divided clock CLKdiv may be generated to have a different frequency from the reference clock CLKref. The divider 150 may provide the divided clock CLKdiv to the time amplifier 111.

The PLL 100 according to the inventive concept may generate the time-pulse conversion time TP that has a pulse width corresponding to the phase difference between the reference clock CLKref and the divided clock CLKdiv. The PLL 100 may continuously control the sustainment time of the changed capacitance of the LC resonance circuit in the digitally controlled oscillator 140 according to the time-pulse conversion signal TP to continuously change the frequency of the output clock CLKout. Thus, the PLL 100 may enhance frequency control resolution. As a result, the PLL 100 may detect a small phase error.

Figure 2:
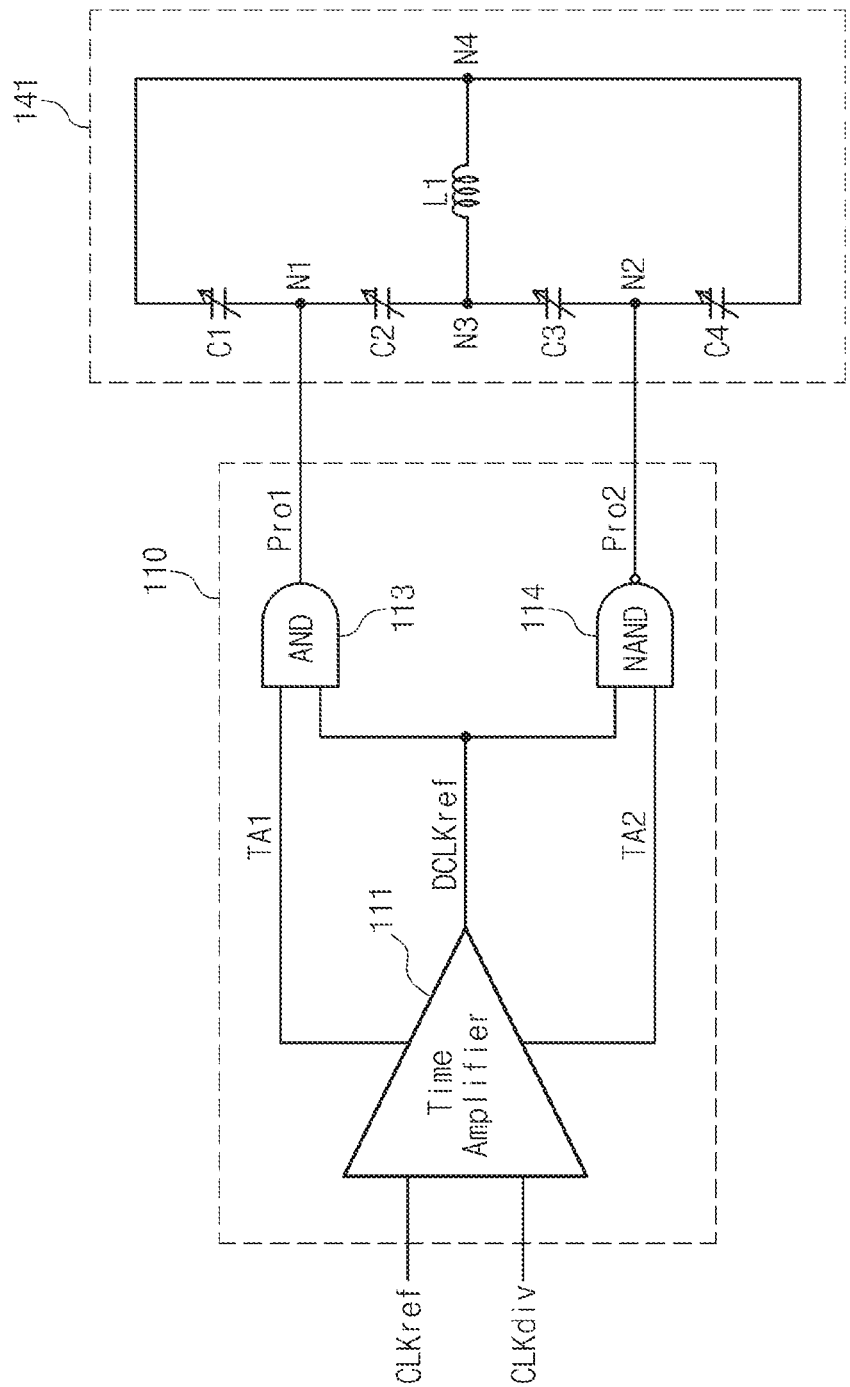
FIG. 2 shows equivalent circuits according to an embodiment of a time-pulse converter and an LC resonance circuit in FIG. 1.

FIG. 2 shows equivalent circuits according to an embodiment of a time-pulse converter and an LC resonance circuit in FIG. 1. Referring to FIG. 2, the LC resonance circuit 141 may include a plurality of capacitors C1 to C4 and an inductor L1. The frequency of the output clock CLKout may be determined according to the time constant of the LC resonance circuit 141. Thus, if the capacitance of the LC resonance circuit 141 is changed, the frequency of the output clock CLKout may be changed. The plurality of capacitors C1 to C4 may be implemented in various devices. For example, the plurality of capacitors C1 to C4 may be implemented in a variable capacitor, transistor or varactor.

The time-pulse converter 110 may include the time amplifier 111 and a plurality of logic gates 113 and 114. In the following, the plurality of logic gates 113 and 114 would be illustrated by using an AND or NAND gate. However, the plurality of logic gates 113 and 114 are not limited thereto. The plurality of logic gates 113 and 114 may be configured in various manners in order to generate gate output signals Pro1 and Pro2.

The time amplifier 111 may receive the reference clock CLKref and the divided clock CLKdiv. The time amplifier 111 may include a plurality of outputs. For example, the time amplifier 111 may output a first time amplifier output signal TA1, a second time amplifier output signal TA2, and a reference clock delay signal DCLKref. The reference clock delay signal DCLKref is a signal that is obtained by delaying the reference clock CLKref for a predetermined time. The first time amplifier output signal TA1 and the second time amplifier output signal TA2 are signals that have pulse widths proportional to the phase difference between the reference clock CLKref and the divided clock CLKdiv. The first time amplifier output signal TA1 and the second time amplifier output signal TA2 may have different pulse widths.

The first logic gate 113 may receive the first time amplifier output signal TA1 and the reference clock delay signal DCLKref. The first logic gate 113 may output a first gate output signal Pro1. For example, the first logic gate 113 may perform AND logic operation.

The second logic gate 114 may receive the second time amplifier output signal TA2 and the reference clock delay signal DCLKref. The second logic gate 114 may output a second gate output signal Pro2. For example, the first logic gate 114 may perform AND logic operation.

The output of the first logic gate 113 may be connected to a first node N1. The output of the second logic gate 114 may be connected to a second node N2. Thus, the plurality of capacitors C1 to C4 may be turned on or turned off according to the first gate output signal Pro1 and the second gate output signal Pro2. As a result, the capacitance of the digitally controlled oscillator 140 may be adjusted according to the first gate output signal Pro1 and the second gate output signal Pro2.

Figure 3:
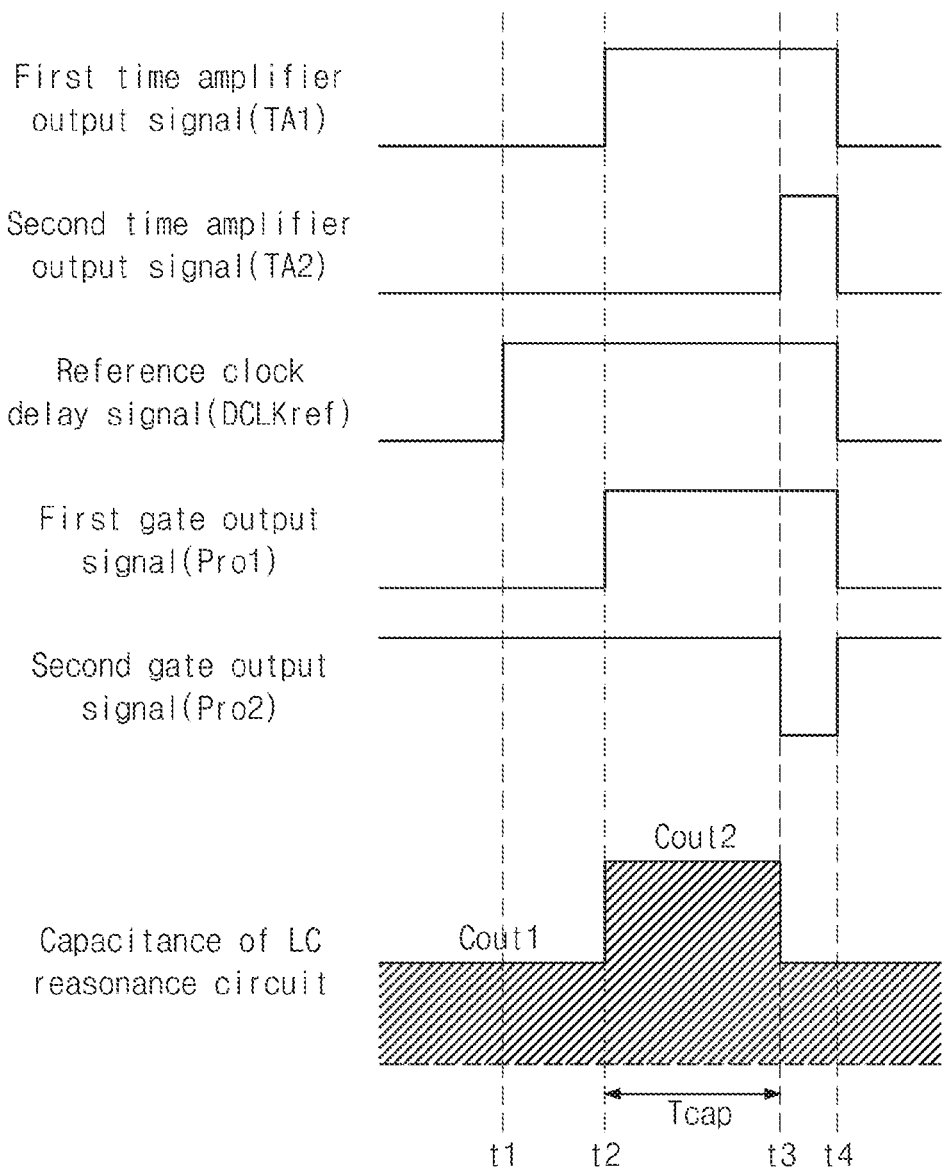
FIG. 3 is an exemplary timing diagram of signals from each of the equivalent circuits in FIG. 2.

FIG. 3 is an exemplary timing diagram of signals from each of the equivalent circuits in FIG. 2. Referring to FIGS. 2 and 3, the capacitance of the LC resonance circuit 141 may be adjusted according to the first and second gate output signals Pro1 and Pro2. Also, the sustainment time of the changed capacitance of the LC resonance circuit 141 may be continuously controlled according to changes in pulse widths of the first and second gate output signals Pro1 and Pro2. FIG. 3 shows, as an example, a change in the capacitance of the digitally controlled oscillator 140 for a single pulse section of the reference clock delay signal DCLKref. In FIG. 3, the hatched portion shows the capacitance of the LC resonance circuit 141 at each time.

The reference clock delay signal DCLKref is a signal that is obtained by delaying the reference clock CLKref input to the time amplifier 111 for a predetermined time. For example, the reference clock delay signal DCLKref may rise at a first time t1 and fall at a fourth time t4.

In the case where there is the phase difference between the reference clock CLKref and the divided clock CLKdiv, the first and second time amplifier output signals TA1 and TA2 may have different pulse widths. The first and second time amplifier output signals TA1 and TA2 may have a pulse width proportional to the phase difference between the reference clock CLKref and the divided clock CLKdiv. For example, the first time amplifier output signal TA1 may rise at a second time t2 and fall at a fourth time t4 to have a first pulse width. The second time amplifier output signal TA2 may rise at a third time t3 and fall at a fourth time t4 to have a second pulse width. The difference Tcap between the first and second pulse widths is proportional to the phase difference between the reference clock CLKref and the divided clock CLKdiv.

The time amplifier 111 may determine the pulse widths of the first and second time amplifier output signals TA1 and TA2 according to predetermined settings. The pulse widths of the first and second time amplifier output signals TA1 and TA2 may continuously vary according to a change in the phase difference between the reference clock CLKref and the divided clock CLKdiv. Also, the time amplifier 111 may enable the falling edges of the first and second time amplifier output signals TA1 and TA2 and the reference clock delay signal DCLKref to be formed at the same time t4.

The first gate output signal Pro1 may be output through the AND logic operation of the reference clock delay signal DCLKref and the first time amplifier output signal TA1. For example, in the case where both the reference clock delay signal DCLKref and the first time amplifier output signal TA1 are in a high level, the first gate output signal Pro1 may be in a high level. That is, the first gate output signal Pro1 may rise at a second time t2 and fall at a fourth time t4.

The second gate output signal Pro2 may be output through the NAND logic operation of the reference clock delay signal DCLKref and the second time amplifier output signal TA2. For example, only when both the reference clock delay signal DCLKref and the second time amplifier output signal TA2 are in a high level, the second gate output signal Pro2 may be in a low level. That is, the second gate output signal Pro2 may start at a high level, fall at a second time t2 and rise at a fourth time t4.

The capacitance of the LC resonance circuit 141 may be adjusted according to the first and second gate output signals Pro1 and Pro2. Before e.g., a second time t2, the first gate output signal Pro1 is in a low level and the second gate output signal Pro2 is in a high level. Thus, only the third and fourth capacitors C3 and C4 may be turned on. The LC resonance circuit 141 may have first capacitance Cout1.

Between the second time t2 and the third time t3, both the first and second gate output signals Pro1 and Pro2 are in a high level. Thus, the first to fourth capacitors C1 to C4 may all be turned on. The LC resonance circuit 141 may have second capacitance Cout2. For example, the second capacitance Cout2 may be two times the first capacitance Cout1.

Between the third time t3 and the fourth time t4, the first gate output signal Pro1 is in a high level and the second gate output signal Pro2 is in a low level. Thus, only the first and second capacitors C1 and C2 may be turned on. The LC resonance circuit 141 may have first capacitance Cout1.

After the fourth time t4, the first gate output signal Pro1 is in a low level and the second gate output signal Pro2 is in a high level. Thus, only the third and fourth capacitors C3 and C4 may be turned on. The LC resonance circuit 141 may have first capacitance Cout1.

As discussed above, the LC resonance circuit 141 may maintain different capacitance from other sections for the sustainment time Tcap of the changed capacitance. For the sustainment time Tcap of the changed capacitance, the digitally controlled oscillator 140 may generate the output clock CLKout that has a changed frequency. The sustainment time Tcap of the changed capacitance may continuously vary according to a change in the phase difference between the reference clock CLKref and the divided clock CLKdiv. As a result, the average frequency of the output clock CLKout may continuously vary according to the sustainment time Tcap of the changed capacitance.

Thus, the PLL 100 according to the inventive concept may continuously control the capacitance of the LC resonance circuit 141 to continuously change the frequency of the output clock CLKout. The PLL 100 may increase frequency control resolution. As a result, the PLL 100 may detect a small phase error.

Figure 4:
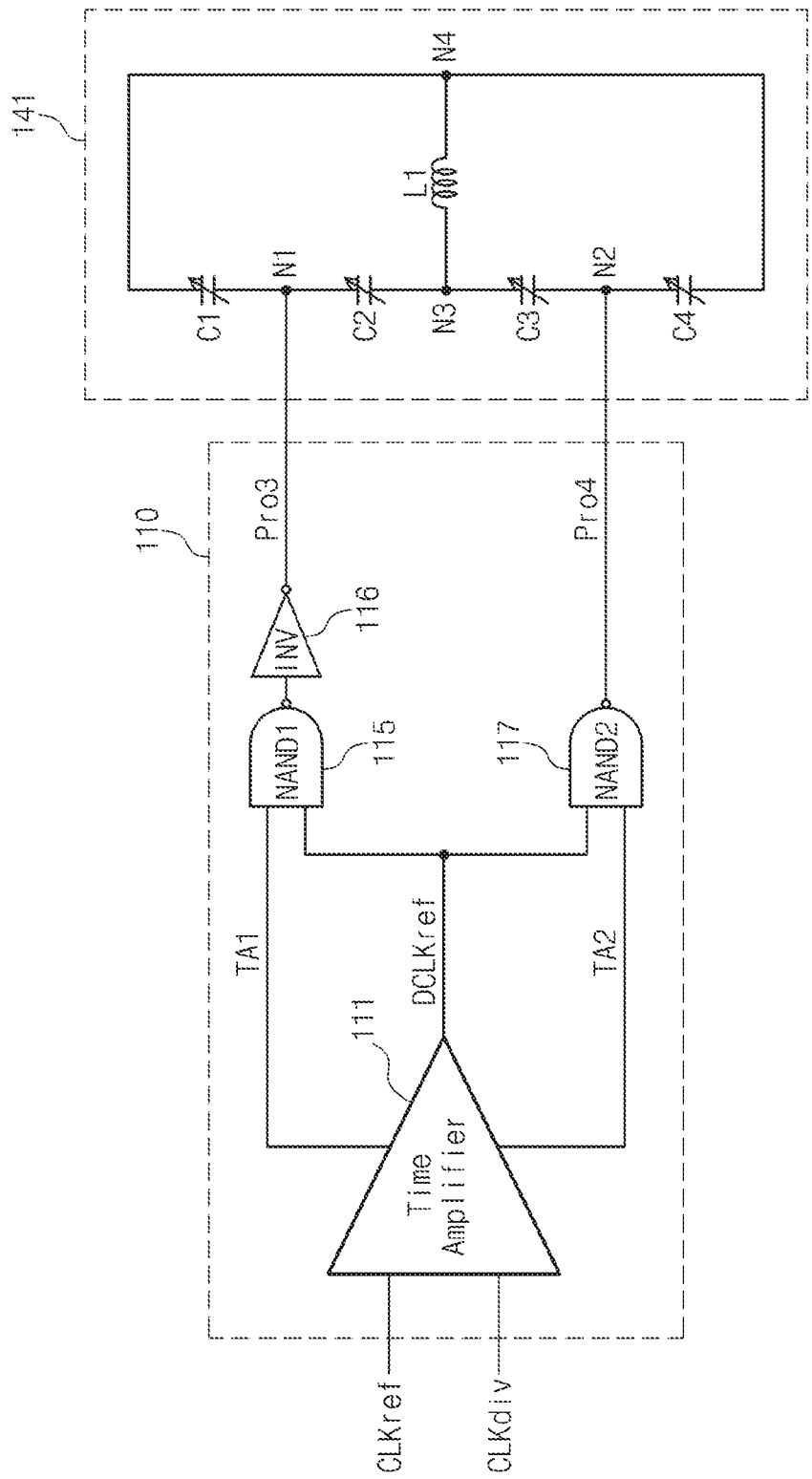
FIG. 4 shows equivalent circuits according to another embodiment of a time-pulse converter and an LC resonance circuit in FIG. 1.

FIG. 4 shows equivalent circuits according to another embodiment of a time-pulse converter and an LC resonance circuit in FIG. 1. Referring to FIG. 4, the LC resonance circuit 141 may include the plurality of capacitors C1 to C4 and the inductor L1. The frequency of the output clock CLKout may be determined according to the time constant of the LC resonance circuit 141. The first logic gate 113 in FIG. 2 may be implemented with a third logic gate 115 and an inverter 116.

The time-pulse converter 110 may include the time amplifier 111, a plurality of logic gates 115 and 117, and the inverter 116. The time amplifier 111 may receive the reference clock CLKref and the divided clock CLKdiv. The time amplifier 111 may include a plurality of outputs. For example, the time amplifier 111 may output the first time amplifier output signal TA1, the second time amplifier output signal TA2, and the reference clock delay signal DCLKref. The reference clock delay signal DCLKref is a signal that is obtained by delaying the reference clock CLKref for a predetermined time. The first and second time amplifier output signals TA1 and TA2 are signals that have pulse widths proportional to the phase difference between the reference clock CLKref and the divided clock CLKdiv. The first time amplifier output signal TA1 and the second time amplifier output signal TA2 may have different pulse widths.

The third logic gate 115 may receive the first time amplifier output signal TA1 and the reference clock delay signal DCLKref. The output of the third logic gate 115 may be input to the inverter 116. The inverter 116 may output a third gate output signal Pro3. For example, the third logic gate 115 may perform NAND logic operation. In addition, the inverter 116 may invert the output signal of the third logic gate 115. That is, the third logic gate 115 and the inverter 116 may output the result of AND logic operation, like the first logic gate 113 in FIG. 2. However, the third gate output signal Pro3 may be somewhat delayed than the first gate output signal Pro1 in FIG. 2 due to the inverter 116.

The fourth logic gate 117 may receive the second time amplifier output signal TA2 and the reference clock delay signal DCLKref. The fourth logic gate 117 may output a fourth gate output signal Pro4. For example, the fourth logic gate 117 may perform NAND logic operation.

The output of the inverter 115 may be connected to the first node N1. The output of the fourth logic gate 117 may be connected to the second node N2. Thus, the plurality of capacitors C1 to C4 may be turned on or turned off according to the third gate output signal Pro3 and the fourth gate output signal Pro4. As a result, the capacitance of the LC resonance circuit 141 may be adjusted according to the third gate output signal Pro3 and the fourth gate output signal Pro4.

Figure 5:
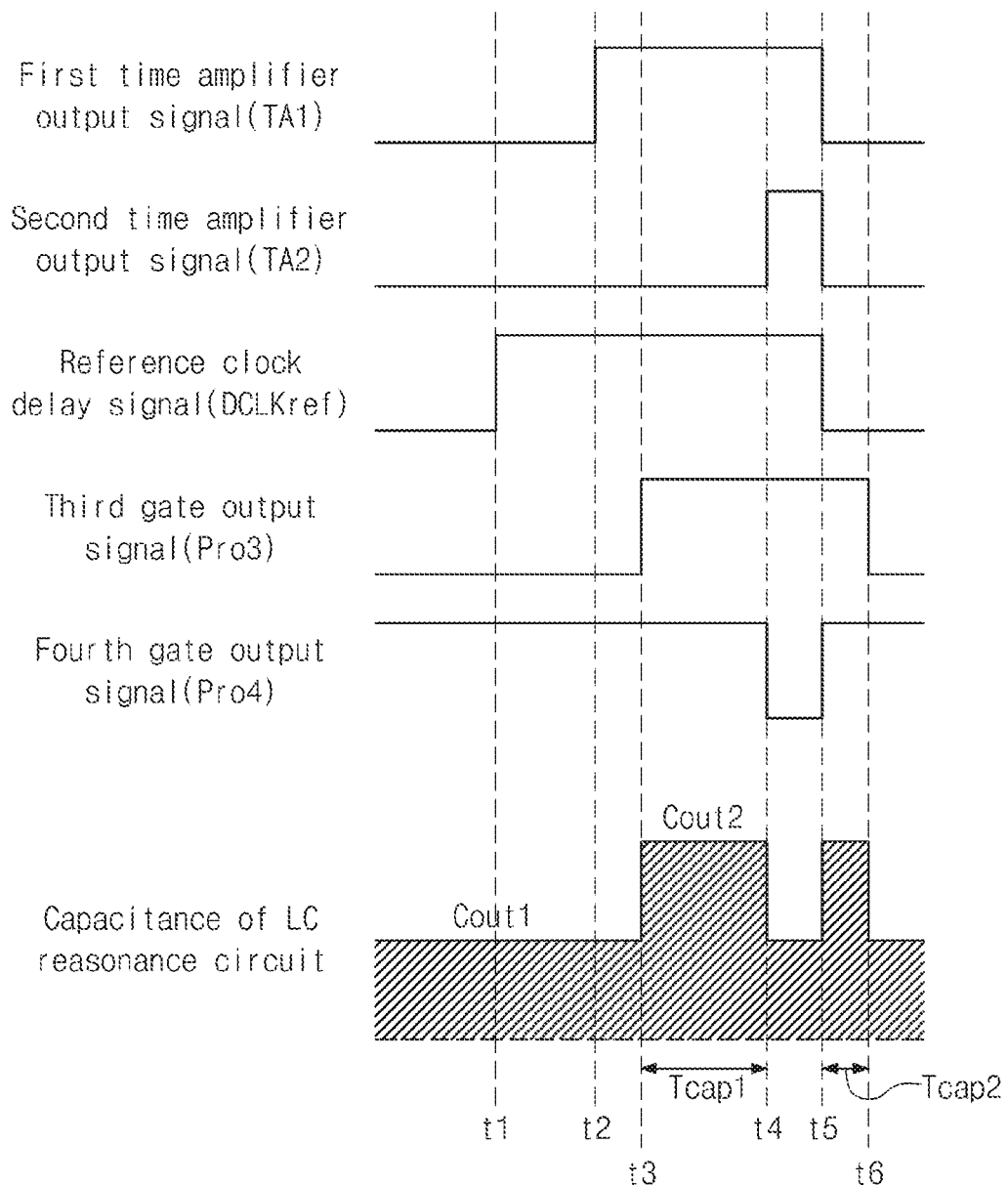
FIG. 5 is an exemplary timing diagram of signals from each of the equivalent circuits in FIG. 4.

FIG. 5 is an exemplary timing diagram of signals from each of the equivalent circuits in FIG. 4. Referring to FIGS. 4 and 5, the capacitance of the LC resonance circuit 141 may be adjusted according to the third gate output signal Pro3 and the fourth gate output signal Pro4. Also, the sustainment time of the changed capacitance of the LC resonance circuit 141 may be continuously controlled according to changes in pulse widths of the third and fourth gate output signals Pro3 and Pro4. FIG. 5 shows, as an example, a change in the capacitance of the digitally controlled oscillator 140 for a single pulse section of the reference clock delay signal DCLKref. In FIG. 5, the hatched portion shows the capacitance of the LC resonance circuit 141 at each time.

However, the third gate output signal Pro3 may be delayed due to the inverter 116. However, the sustainment time of the changed capacitance of the LC resonance circuit may be continuously maintained irrespective of the delay of the third gate output signal Pro3. For example, the sum of the sustainment time Tcap1 of first changed capacitance and the sustainment time Tcap2 of second changed capacitance in FIG. 5 may be the same as the sustainment time Tcap of the changed capacitance in FIG. 3.

The reference clock delay signal DCLKref is a signal that is obtained by delaying the reference clock CLKref input to the time amplifier 111 for a predetermined time. For example, the reference clock delay signal DCLKref may rise at a first time t1 and fall at a fifth time t5.

In the case where there is the phase difference between the reference clock CLKref and the divided clock CLKdiv, the first and second time amplifier output signals TA1 and TA2 may have different pulse widths. The first and second time amplifier output signals TA1 and TA2 may have pulse widths proportional to the phase difference between the reference clock CLKref and the divided clock CLKdiv. For example, the first time amplifier output signal TA1 may rise at a second time t2 and fall at the fifth time t5 to have a first pulse width. The second time amplifier output signal TA2 may rise at a fourth time t4 and fall at the fifth time t5 to have a second pulse width. The difference Tcap1+Tcap2 between the first and second pulse widths is proportional to the phase difference between the reference clock CLKref and the divided clock CLKdiv.

The time amplifier 111 may determine the pulse widths of the first and second time amplifier output signals TA1 and TA2 according to predetermined settings. The pulse widths of the first and second time amplifier output signals TA1 and TA2 may continuously vary according to a change in the phase difference between the reference clock CLKref and the divided clock CLKdiv. Also, the time amplifier 111 may enable the falling edges of the first and second time amplifier output signals TA1 and TA2 and the reference clock delay signal DCLKref to be formed at the same time t5.

The third gate output signal Pro3 may be invert and output the signal output through the NAND logic operation of the reference clock delay signal DCLKref and the first time amplifier output signal TA1. For example, in the case where both the reference clock delay signal DCLKref and the first time amplifier output signal TA1 are in a high level, the third gate output signal Pro3 may be in a high level. However, the third gate output signal Pro3 may be delayed due to the inverter 116. That is, the third gate output signal Pro3 may rise at a third time t3 and fall at a sixth time t6. The third gate output signal Pro3 may be delayed for a time corresponding to the difference between the second time t2 and the third time t3, as compared to the first gate output signal Pro1 in FIG. 3.

The fourth gate output signal Pro4 may be output through the NAND logic operation of the reference clock delay signal DCLKref and the second time amplifier output signal TA2. For example, only when both the reference clock delay signal DCLKref and the second time amplifier output signal TA2 are in a high level, the fourth gate output signal Pro4 may be in a low level. That is, the fourth gate output signal Pro4 may start at a high level, fall at the fourth time t4 and rise at the fifth time t5.

The capacitance of the LC resonance circuit 141 may be adjusted according to the third and fourth gate output signals Pro3 and Pro4. Before e.g., the third time t3, the third gate output signal Pro3 is in a low level and the fourth gate output signal Pro4 is in a high level. Thus, only the third and fourth capacitors C3 and C4 may be turned on. The LC resonance circuit 141 may have first capacitance Cout1.

Between the third time t3 and the fourth time t4, both the third and fourth gate output signals Pro3 and Pro4 are in a high level. Thus, the first to fourth capacitors C1 to C4 may all be turned on. The LC resonance circuit 141 may have second capacitance Cout2. For example, the second capacitance Cout2 may be two times the first capacitance Cout1.

Between the fourth time t4 and the fifth time t5, the third gate output signal Pro3 is in a high level and the fourth gate output signal Pro4 is in a low level. Thus, only the first and second capacitors C1 and C2 may be turned on. The LC resonance circuit 141 may have first capacitance Cout1.

Between the fifth time t5 and the sixth time t6, both the third and fourth gate output signals Pro3 and Pro4 are in a high level. Thus, the first to fourth capacitors C1 to C4 may all be turned on. The LC resonance circuit 141 may have second capacitance Cout2.

After the sixth time t6, the third gate output signal Pro3 is in a low level and the fourth gate output signal Pro4 is in a high level. Thus, only the third and fourth capacitors C3 and C4 may be turned on. The LC resonance circuit 141 may have first capacitance Cout1.

As discussed above, the LC resonance circuit 141 may maintain different capacitance from other sections for the sustainment times Tcap1 and Tcap2 of the first and second changed capacitance. For the sustainment times Tcap1 and Tcap2 of the first ands second changed capacitance, the digitally controlled oscillator 140 may generate the output clock CLKout that has a changed frequency. The sum of the sustainment times Tcap1 and Tcap2 of the first and second changed capacitance may be the same as the sustainment time Tcap of the changed capacitance in FIG. 3. Thus, the sum of the sustainment times Tcap1 and Tcap2 of the first and second changed capacitance may be constantly maintained irrespective of the delay of the third gate output signal Pro3 by the inverter 116.

Also, the sum of the sustainment times Tcap1 and Tcap2 of the first and second changed capacitance may continuously vary according to a change in the phase difference between the reference clock CLKref and the divided clock CLKdiv. As a result, the average frequency of the output clock CLKout may continuously vary according to the sum of the sustainment times Tcap1 and Tcap2 of the first and second changed capacitance.

Thus, the PLL 100 according to the inventive concept may continuously control the capacitance of the LC resonance circuit 141 to continuously change the frequency of the output clock CLKout. The PLL 100 may increase frequency control resolution. As a result, the PLL 100 may detect a small phase error.

Figure 6:
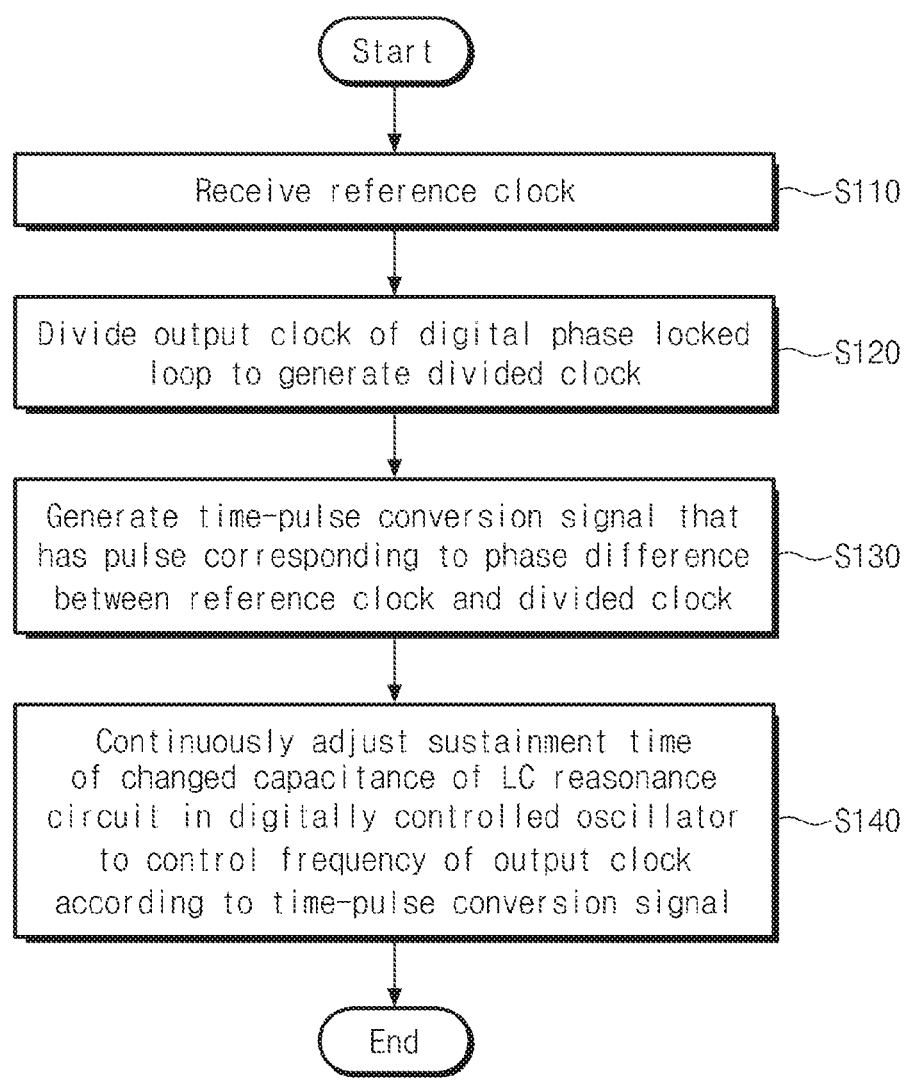
FIG. 6 is a flowchart of an operating method of a PLL according to an embodiment of the inventive concept.

FIG. 6 is a flowchart of an operating method of a PLL according to an embodiment of the inventive concept. Referring to FIGS. 1 to 6, the PLL 100 may continuously adjust a time interval for maintaining the changed capacitance of the LC resonance circuit 140 according to a change in the phase difference between the reference clock CLKref and the divided clock CLKdiv to continuously control the frequency of the output clock CLKout.

In step S110, the PLL 100 may receive the reference clock CLKref. The PLL 100 may generate the output clock CLKout corresponding to the reference clock CLKref.

In step S120, the PLL 100 may divide the output clock CLKout by a predetermined division value through the divider 150 to generate the divided clock CLKdiv. For example, the divided clock CLKdiv may be have the same frequency as the reference clock CLKref. Also, the divided clock CLKdiv may have a different frequency from the reference clock CLKref.

In step S130, the PLL 100 may generate the time-pulse conversion time TP that has a pulse corresponding to the phase difference between the reference clock CLKref and the divided clock CLKdiv. For example, the time amplifier 111 may output the first time amplifier output signal TA1, the second time amplifier output signal TA2, and the reference clock delay signal DCLKref. The reference clock delay signal DCLKref is a signal that is obtained by delaying the reference clock CLKref for a predetermined time. The first time amplifier output signal TA1 and the second time amplifier output signal TA2 are signals that have pulse widths proportional to the phase difference between the reference clock CLKref and the divided clock CLKdiv. In the case where the phase of the reference clock and the phase of the divided clock are different from each other, the first time amplifier output signal TA1 and the second time amplifier output signal TA2 may have different pulse widths.

The first logic gate 113 may receive the first time amplifier output signal TA1 and the reference clock delay signal DCLKref. The first logic gate 113 may output the first gate output signal Pro1. For example, the first logic gate 113 may perform AND logic operation.

The second logic gate 114 may receive the second time amplifier output signal TA2 and the reference clock delay signal DCLKref. The second logic gate 114 may output the second gate output signal Pro2. For example, the second logic gate 114 may perform NAND logic operation.

The time-pulse conversion signal TP may include the first and second gate output signals Pro1 and Pro2. The first and second gate output signals Pro1 and Pro2 may be transmitted to the digitally controlled oscillator 140.

In step S140, the PLL 100 may continuously adjust the sustainment time of the changed capacitance of the LC resonance circuit in the digitally controlled oscillator 140 according to the time-pulse conversion signal TP to control the frequency of the output clock CLKout. The frequency of the output clock CLKout may be determined according to the time constant of the LC resonance circuit. Also, regarding the PLL 100, locking the frequency of the output clock CLKout means constantly maintaining the average frequency of the output clock CLKout. The average frequency of the output clock CLKout may be constantly maintained by the adjustment of a time interval for changing the capacitance of the LC resonance circuit.

For example, the capacitance of the LC resonance circuit 141 in FIG. 3 may be adjusted according to the first and second gate output signals Pro1 and Pro2. Before e.g., the second time t2, the LC resonance circuit 141 may have first capacitance Cout1. The LC resonance circuit 141 may have second capacitance between the second time t2 and the third time t3. After the third time t3, the LC resonance circuit 141 may have first capacitance Cout1.

That is, the LC resonance circuit 141 may maintain different capacitance from other sections for the sustainment time Tcap of the changed capacitance. For the sustainment time Tcap of the changed capacitance, the digitally controlled oscillator 140 may generate the output clock CLKout that has a changed frequency. The sustainment time Tcap of the changed capacitance may continuously vary according to a change in the phase difference between the reference clock CLKref and the divided clock CLKdiv. As a result, the average frequency of the output clock CLKout may continuously vary according to the sustainment time Tcap of the changed capacitance.

Thus, the PLL 100 according to the inventive concept may continuously control the sustainment time of the changed capacitance of the LC resonance circuit 141 to continuously change the frequency of the output clock CLKout. The PLL 100 may increase frequency control resolution. As a result, the PLL 100 may detect a small phase error.

An embodiment of the inventive concept provides the PLL and an operating method thereof that use a time amplifier to continuously control the frequency of the digitally controlled oscillator in an analogue manner to increase the frequency control resolution and improve a phase error detection resolution to decrease phase noise.

Best embodiments are described in the drawings and the disclosure as described above. Although specific terms are used herein, they are only intended to describe the inventive concept and are not intended to limit meanings or the scope of the inventive concept described in the following claims.

Therefore, a person skilled in the art may understand that various variations and equivalent embodiments may be implemented. Thus, the true protective scope of the inventive concept will be defined by the technical spirit of the following claims.

What is claimed is:

1. A phase locked loop (PLL) that generates an output clock signal corresponding to a reference clock signal, the phase locked loop (PLL) comprising:
   a divider configured to divide the output clock signal to generate a divided clock signal;
   a time-pulse converter configured to generate a time-pulse conversion signal that has a pulse corresponding to a phase difference between the reference clock signal and the divided clock signal; and
   a digitally controlled oscillator comprising an LC resonance circuit for generating the output clock signal and configured to control a frequency of the output clock signal that is determined based on a time constant of the LC resonance circuit and the time-pulse conversion signal,
   wherein a sustainment time of changed capacitance for which capacitance of the LC resonance circuit is maintained in a changed state is continuously controlled according to a change in the phase difference between the reference clock signal and the divided clock signal.

2. The phase locked loop (PLL) of claim 1, wherein the time-pulse converter comprises a time amplifier that is configured to generate at least one time amplifier output signal that has a pulse width proportional to the phase difference between the reference clock signal and the divided clock signal.

3. The phase locked loop (PLL) of claim 2, wherein the time-pulse converter comprises a time-pulse conversion unit that is configured to convert the at least one time amplifier output signal into the time-pulse conversion signal through logic operation.

4. The phase locked loop (PLL) of claim 2, wherein the time amplifier is configured to generate a first time amplifier output signal that has a first pulse width proportional to the phase difference between the reference clock signal and the divided clock signal, a second time amplifier output signal that has a second pulse width proportional to the phase difference between the reference clock signal and the divided clock signal, and a reference clock delay signal that is obtained by delaying of the reference clock for a predetermined time, and
   the pulse width of the first time amplifier output signal and the pulse width of the second time amplifier output signal are controlled to be different from each other when a phase of the reference clock and a phase of the divided clocks are different from each other.

5. The phase locked loop (PLL) of claim 4, wherein the time-pulse converter comprises a first logic gate that is configured to output a first gate output signal through first logic operation on the first time amplifier output signal and the reference clock delay signal, and a second logic gate that is configured to output a second gate output signal through second logic operation on the second time amplifier output signal and the reference clock delay signal.

6. The phase locked loop (PLL) of claim 5, wherein the first logic operation is AND operation and the second logic operation is NAND operation.

7. The phase locked loop (PLL) of claim 5, wherein a plurality of capacitors in the LC resonance circuit are configured to be turned on or off selectively according to the first gate output signal and the second gate output signal.

8. The phase locked loop (PLL) of claim 1, wherein the time-pulse converter comprises a time amplifier that is configured to generate a reference clock delay signal and a divided-clock delay signal that are obtained by delaying of the reference clock and the divided clock for a predetermined time, and
   the PLL further comprises a comparator that is configured to detect a phase difference between the reference clock delay signal and the divided-clock delay signal to output a phase error value.

9. The phase locked loop (PLL) of claim 8, further comprising an integrator that is configured to integrate the phase error value to transmit the integrated value to the digitally controlled oscillator.

10. The phase locked loop (PLL) of claim 1, wherein a sustainment time of the changed capacitance is proportional to a pulse width of the time-pulse conversion signal.

11. An operating method of a phase locked loop (PLL) that generates an output clock signal corresponding to a reference clock signal, the operating method comprising:
   receiving the reference clock signal;
   dividing the output clock signal to generate a divided clock signal;
   generating a time-pulse conversion signal that has a pulse corresponding to a phase difference between the reference clock signal and the divided clock signal; and
   changing capacitance of an LC resonance circuit included in a digitally controlled oscillator for generating the output clock signal according to the time-pulse conversion signal to control a frequency of the output clock signal,
   wherein a sustainment time of changed capacitance for which the capacitance of the LC resonance circuit is maintained in a changed state is continuously controlled according to a change in the phase difference between the reference clock signal and the divided clock signal.

12. The operating method of claim 11, wherein the generating of the time-pulse signal comprises:
   generating, by a time amplifier, first amplifier output signals that have a first pulse width proportional to the phase difference between the reference clock and the divided clock;
   generating, by the time amplifier, second amplifier output signals that have a second pulse width proportional to the phase difference between the reference clock and the divided clock;
   generating, by the time amplifier, a reference clock delay signal that is obtained by delaying of the reference clock for a predetermined time;
   generating a first gate output signal through first logic operation on the first time amplifier output signal and the reference clock delay signal; and
   generating a second gate output signal through second logic operation on the second time amplifier output signal and the reference clock delay signal,
   wherein the first pulse width and the second pulse width are controlled to be different from each other, when a phase of the reference clock and a phase of the divided clock are different from each other.

13. The operating method of claim 12, wherein the sustainment time of the changed capacitance is continuously adjusted according to the first gate output signal and the second gate output signal.

14. The operating method of claim 12, wherein a plurality of capacitors in the LC resonance circuit are configured to be turned on or off selectively according to the first gate output signal and the second gate output signal.

\* \* \* \* \*